(12) United States Patent
Barber et al.

(10) Patent No.: US 6,612,625 B1
(45) Date of Patent: Sep. 2, 2003

(54) CASE LOCKING SYSTEM

(75) Inventors: Kyle L. Barber, Austin, TX (US); Larry J. Watson, Austin, TX (US)

(73) Assignee: Genesis Technical Marketing, Inc., Austin, TX (US)

(*) Notice: Subject to any disclaimer, the term of this patent is extended or adjusted under 35 U.S.C. 154(b) by 30 days.

(21) Appl. No.: 09/659,402

(22) Filed: Sep. 11, 2000

(51) Int. Cl.[7] .............................................. E05C 19/06
(52) U.S. Cl. ............. 292/87; 292/341.14; 292/DIG. 11; 292/302; 292/303; 292/304; 220/326
(58) Field of Search ............................ 292/87, 341.14, 292/302–304, 102, 128, 101, 228, 202, 203, DIG. 11; 49/193, 394; 220/326, 786

(56) References Cited

U.S. PATENT DOCUMENTS

| | | | | |
|---|---|---|---|---|
| 2,031,302 A | * | 2/1936 | Clark .......................... 292/304 |
| 2,480,988 A | * | 9/1949 | Walton ........................ 292/218 |
| 2,936,189 A | * | 5/1960 | Pearson ...................... 220/326 |
| 3,797,219 A | * | 3/1974 | Kieronski et al. ............ 57/135 |
| 4,830,182 A | | 5/1989 | Nakazato et al. ........... 206/334 |
| 4,893,850 A | * | 1/1990 | Mizusawa ................... 292/128 |
| 5,044,810 A | * | 9/1991 | Matsuoka et al. ............ 403/93 |
| 5,785,398 A | * | 7/1998 | Park ........................ 312/223.2 |
| 5,979,691 A | * | 11/1999 | Von Holdt ................... 220/266 |
| 6,129,395 A | * | 10/2000 | Schlesener et al. ......... 292/128 |
| 6,145,898 A | * | 11/2000 | Onderka et al. ............ 292/228 |

* cited by examiner

Primary Examiner—Anthony Knight
Assistant Examiner—John B. Walsh
(74) Attorney, Agent, or Firm—J. Nevin Shaffer, Jr.; Shaffer & Culbertson LLP

(57) ABSTRACT

A case locking system (10) includes two pairs of independently movable split levers (16). Split levers (16) are connected to top (12) and form more than two separate latches (20 and 22) movable between an open position and a closed position. Latch receivers (34) are connected to bottom (14) and are conformed to independently receive and retain each separate latch (20 and 22). In a preferred embodiment, two pairs of independently movable split levers (16) form four separate latches (20 and 22). In a further preferred embodiment, locking ramps (36) are connected to bottom (14) for automatically opening latches (20 and 22) when the top (12) is placed on to the bottom (14). In a further embodiment, alignment guides (56) and alignment posts (48) are utilized to automatically position latches (20 and 22) and latch receivers (34) when the top (12) is placed on the bottom (14).

14 Claims, 5 Drawing Sheets

CASE LOCKING SYSTEM

BACKGROUND OF THE INVENTION

This invention relates to an improved case locking system. In particular, this invention relates to an improved case locking system for cases having a removable top and a bottom. More particularly, this invention relates to an improved locking system for reticle cases.

It often does not matter how securely a top is connected to a bottom of a case. Nonetheless, there are circumstances where securing the top to the bottom of a case and insuring that the top stays in place is extraordinarily important. In particular, in the computer environment the creation of computer reticles is a high-cost, high-risk procedure where any inadvertent removal of the top from the bottom of the reticle case can destroy a multi-thousand dollar investment in a second.

While the present invention is not limited to reticle cases, it is the preferred environment and finds, perhaps, its most readily apparent need. A problem with the prior art reticle cases/cassettes known in the art is that they are prone to inadvertently open. This occurs when a user of prior art cases picks up the case by the most obvious means i.e. the handles. Currently, unless a user is knowledgeable and prevents the activation of the handles while lifting a reticle case, the mere picking up of the reticle case by the handles is sufficient to separate the top from the bottom.

An associated problem with the prior art reticle cases is that reattaching the top to the bottom requires careful attention and strict alignment while manipulating the handles. Time is money in most businesses and the computer industry is no exception. This time-consuming and awkward connection process is unsatisfactory and, again, can result in the loss of thousands of dollars because of the delay.

Thus, there is a need in the art for providing a case locking system that prevents a user from inadvertently separating the top of the case from the bottom of the case while handling the case. Further, there is a need in the art for providing a case locking system that easily and automatically locks the top and the bottom together without awkward manipulation of the top, bottom, and handles. It, therefore, is an object of this invention to provide an improved case locking system for easily connecting a top to a bottom of a case and for insuring that a case top may be handled without fear of inadvertent separation from the bottom once connected.

SHORT STATEMENT OF THE INVENTION

Accordingly, the case locking system of the present invention includes two pairs of independently movable split levers connected to the top of a case with a top and a bottom. The two pairs of independently movable split levers form more than two separate latches. The more than two separate latches are movable between an open and a closed position. Further, each of the more than two separate latches are continuously forced in the closed position direction.

Corresponding latch receivers are formed in the bottom and are conformed to independently receive and retain each separate latch. In a preferred embodiment, the two pairs of independently movable split levers form four separate latches. In a further preferred embodiment, locking ramps are connected to the base for automatically opening the latches when the top is being placed onto the bottom.

In a still further embodiment, alignment guides are connected to the top and alignment posts are connected to the bottom. The alignment posts and the alignment guides cooperate together to automatically position the latches and the latch receivers when the top is placed on the bottom. In a preferred embodiment, sensor tabs are connected to each of the separate latches. Further, in a preferred embodiment a pair of hanging pins supports one pair each of the independently movable split levers. The split levers hang and rotate on the hanging pins and the hanging pins have knurled ends which are securely and immovably attached to the top.

BRIEF DESCRIPTION OF THE DRAWINGS

Other objects, features and advantages of the present invention will become more fully apparent from the following detailed description of the preferred embodiments, the appended claims and the accompanying drawings in which:

DETAILED DESCRIPTION OF THE PREFERRED EMBODIMENTS

Figure 1:
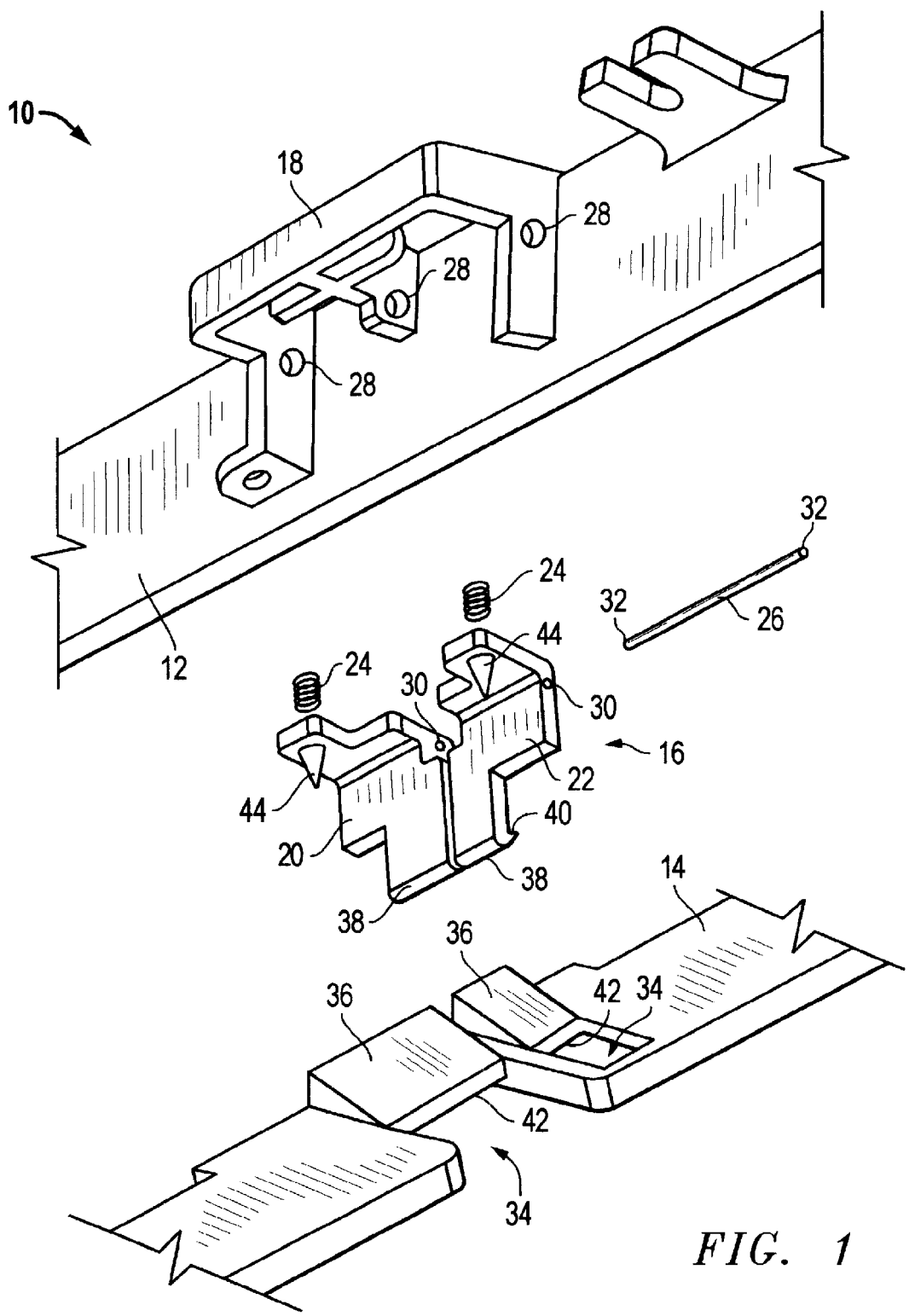
FIG. 1 is an isometric exploded view of the movable split levers of the present invention for connection to the top in juxtaposition with the latch receivers in the bottom.

The preferred embodiments of the present invention are illustrated by way of example in FIGS. 1–9. With specific reference to FIGS. 1–3, case locking system 10 includes top 12, and bottom 14. A pair of independently movable split levers 16 is connected to top 12 by frame 18. Independently movable split levers 16 forms two separate latches 20 and 22. Also shown in this exploded view are bias springs 24 and hanging pin 26. Frame 18 has connection holes 28 and independently movable split levers 16 have connection holes 30. As shown more clearly in FIG. 2, when independently movable split levers 16 are placed into position on frame 18, bias springs 24 are captured between frame 18 and independently movable split levers 16 and continuously force independently movable split levers 16 in one direction i.e. the closed direction. Alignment of connection holes 28 and connection holes 30 allows the insertion of hanging pin 26 thereby movably and rotatably connecting independently movable split levers 16 to top 12 via frame 18. Importantly, hanging pin 26 is a single, long, pin unlike prior art multiple pins that are short and prone to working free. Additionally, in a preferred embodiment, hanging pin 26 includes knurled ends 32. The addition of knurled ends 32 to hanging pin 26 ensures that a secure, immovable connection is made to top 12 so that hanging pin 26 cannot work itself free.

Still referring to FIG. 1, bottom 14 includes latch receivers 34. Latch receivers 34 are conformed to receive and retain latch 20 and latch 22. Also illustrated in FIG. 1, are bottom 14 locking ramps 36. Latches 20 and 22 include ends 38 and hooks 40. In operation, as top 12 is lowered on to bottom 14, the ends 38 of latches 20 and 22 contact the sloped surface of locking ramps 36 and are forced open against the pressure of bias springs 24. Once the ends 38 pass over the edges 42 of locking ramps 36, the hooks 40 engage latch receivers 34.

Finally, FIG. 1 illustrates sensor tabs 44 connected to latches 20 and 22. As will be described more fully hereafter, in operation, a user knows when his or her fingers are in position to operate latches 20 and 22 by tactile feedback provided by sensor tabs 44.

Figure 2:
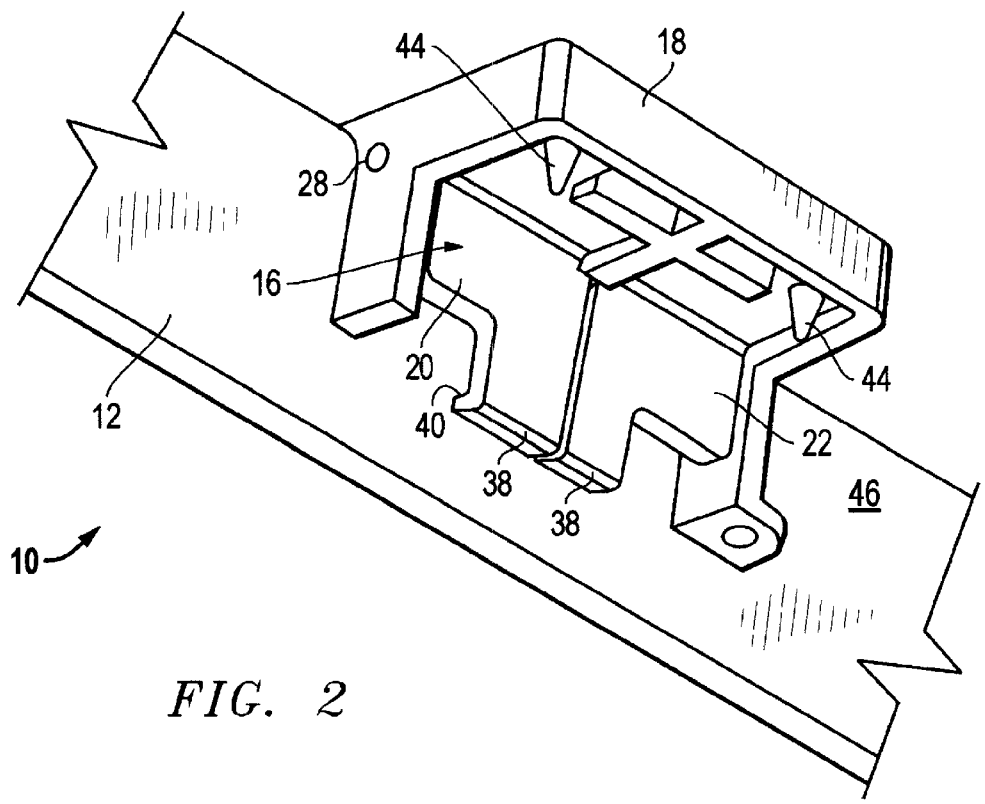
FIG. 2 is an isometric view of the movable split levers connected to the top.
Figure 3:
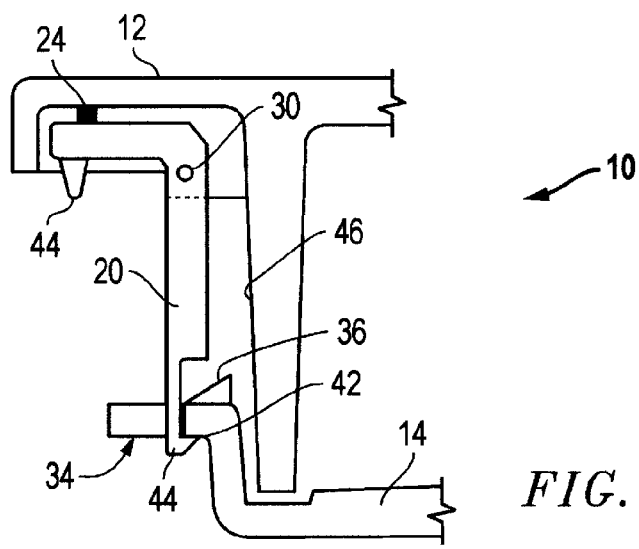
FIG. 3 is a side view of the movable split levers connected to the top.

Referring now to FIG. 2, independently movable split levers 16, including latch 20 and latch 22, are shown connected to top 12 by means of the frame 18. In this position, bias springs 24 (not shown) continuously force latches 20 and 22 to the closed position in contact with the side 46 of top 12. FIG. 3 is a side view showing top 12 in position on bottom 14 with the hook 40 of latch 20 engaged with edge 42 of ramp 36. The bias spring 24 continuously forces latch 20 to the closed position thereby assuring that hook 40 will not inadvertently become unattached.

Figure 4:
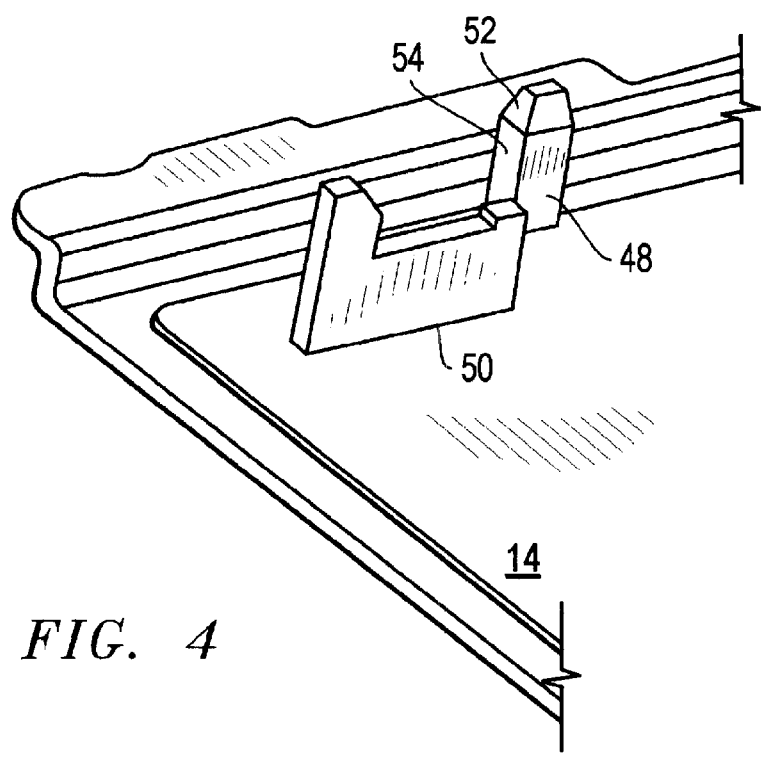
FIG. 4 is an isometric partial view of the bottom showing an alignment post.
Figure 5:
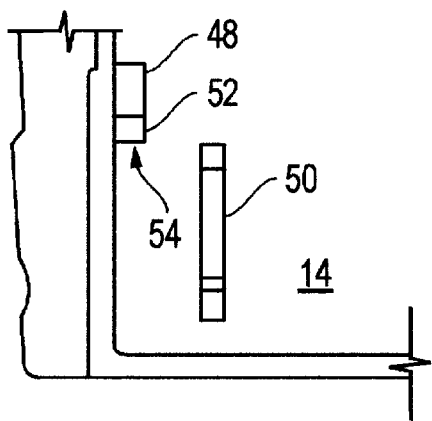
FIG. 5 is a partial top view of FIG. 4.
Figure 6:
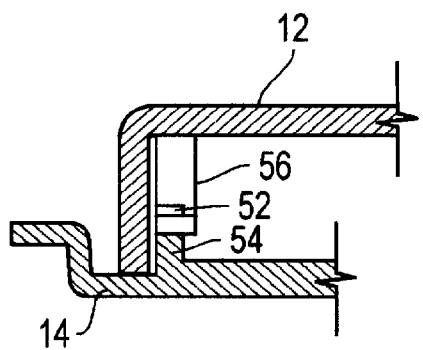
FIG. 6 is a partial side view showing the top in place on the bottom and showing an alignment guide connected to the top.

Referring now to FIGS. 4 and 5, a preferred embodiment of the present invention is illustrated wherein bottom 14 includes alignment posts 48. Also illustrated is reticle support stand 50. In applicants' invention, alignment posts 48 are vertically connected to the bottom 14 extending upwardly therefrom. In a preferred embodiment, alignment post 48 includes an inwardly sloping top edge 52 and an outside 54. FIG. 6 illustrates a preferred embodiment of the present invention whereby top 12 has been brought to connection with bottom 14 by means of the alignment guides 56 connected to top 12. In operation, alignment guides 56 contact inwardly sloping top edges 52 of the alignment posts 48 as top 12 is lowered on to bottom 14. Any misalignment of top 12 with bottom 14 is automatically corrected as alignment guides 56 slide down sloping top edge 52 of alignment post 48 until such time as alignment post 48 and alignment guides 56 are correctly aligned along the outside 54 of post 48. Alignment posts 48 and alignment guides 56 are constructed so as to ensure that when they are aligned, latches 20 and 22 are also properly aligned with latch receivers 34. FIG. 6 shows alignment post 48 as visible through alignment guide 56. Since a preferred embodiment includes clear plastic construction this view is appropriate, nonetheless, as to the posts 48 and guides 56, it is not required that they be made of clear materials.

Figure 7:
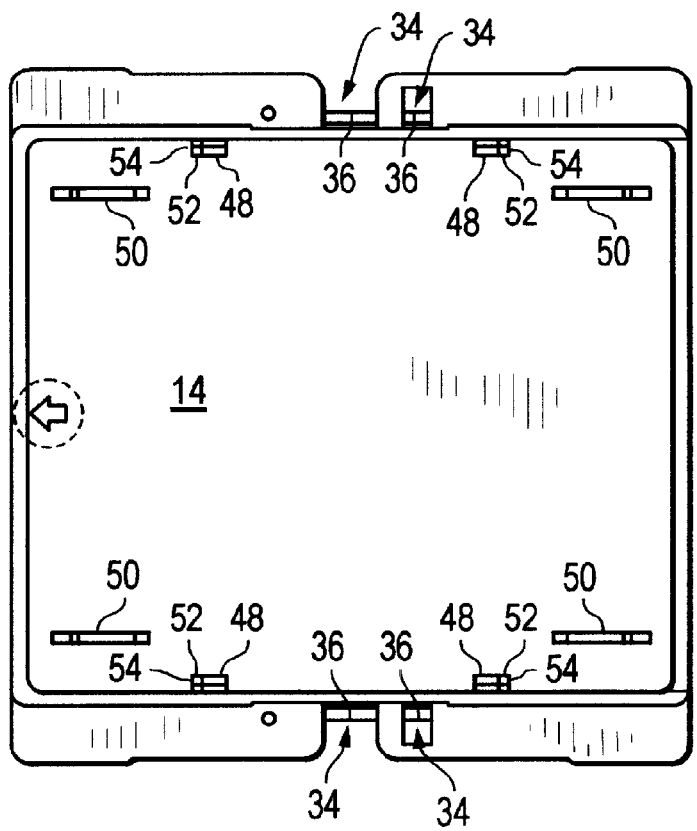
FIG. 7 is a top view of the bottom.
Figure 8:
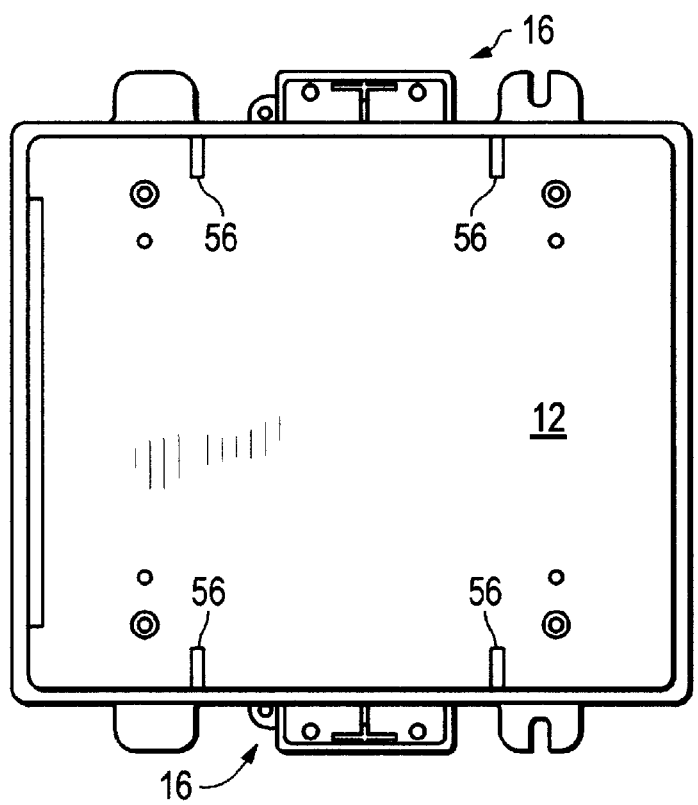
FIG. 8 is a bottom view of the top.

FIG. 7 illustrates a preferred embodiment of the present invention whereby four latch receivers 34 in conjunction with four locking ramps 36 and four alignment posts 48 are all provided in bottom 14. FIG. 8 is an illustration of a preferred embodiment of the present invention that coordinates and cooperates with the embodiment illustrated in FIG. 7. FIG. 8 shows top 12 with two pairs of independently movable split levers 16 forming two pairs of oppositely positioned latches 20 and 22. Also shown are four alignment guides 56, once again positioned so as to cooperate with alignment posts 48 in the automatic alignment of top 12 with bottom 14 simply by placing top 12 over bottom 14 and allowing top 12 to slide into place by its own weight.

Figure 9:
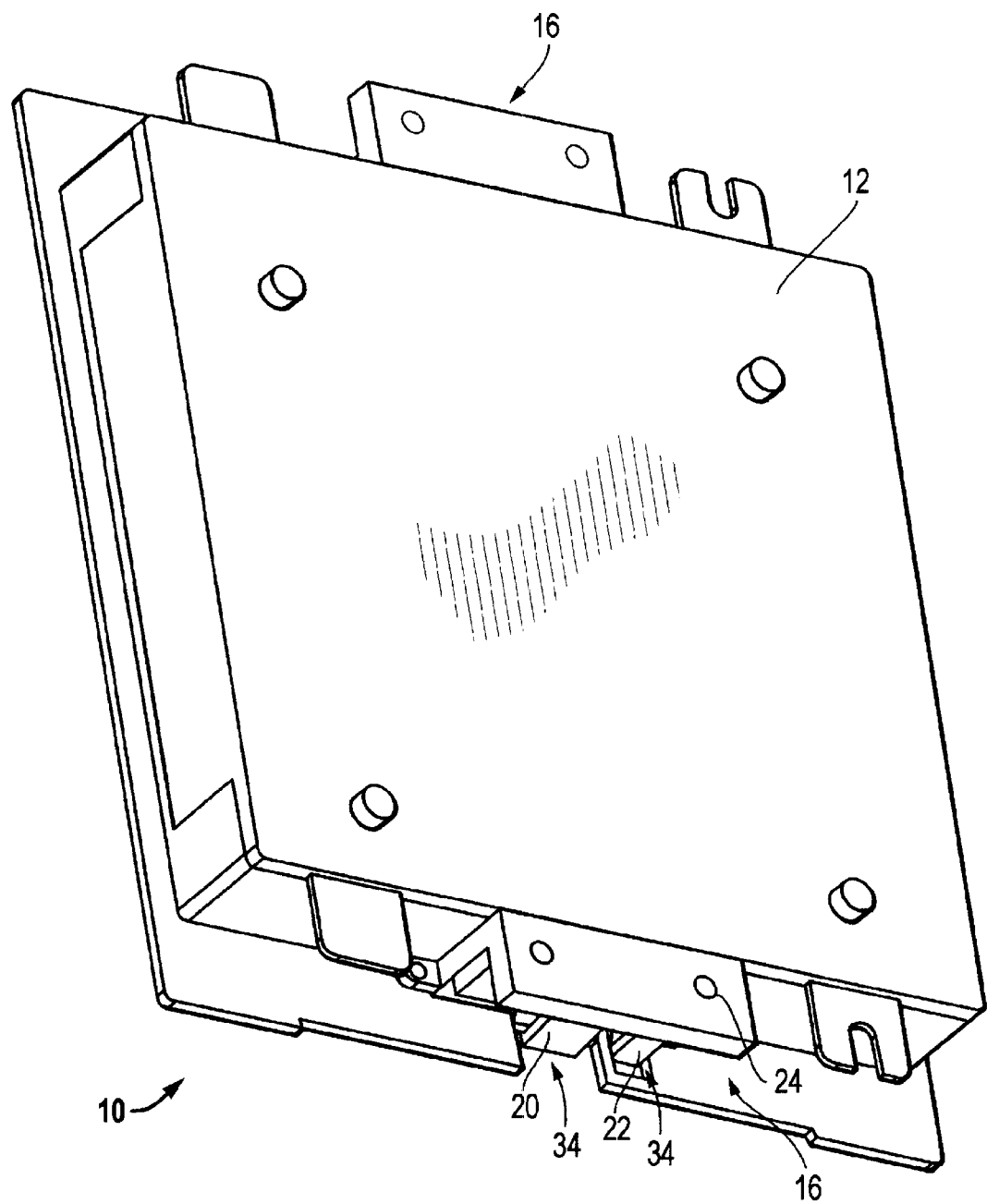
FIG. 9 is an isometric view of the invention with the top in place on the bottom.

FIG. 9 illustrates an isometric view of the case locking system 10 of the present invention. By means of the present invention, applicants have determined that case locking system 10 provides a sure solution to the twin problems of difficulty in aligning the top and the bottom and the inadvertent opening of top 12. As previously mentioned, by means of Applicants' invention, attachment of top 12 to bottom 14 is automatic. When top 12 is positioned over bottom 14, alignment post 48 and alignment guides 56 ensure that latches 20 and 22 on both sides of top 12 are in the correct position. As top 12 is lowered, or allowed to slide or drop, ends 38 of latches 20 and 22 engage the sloping surface of locking ramps 36. This force latches 20 and 22 away from the closed position mandated by bias springs 24 until such time as hooks 40 pass by edges 42 and are allowed to slip into place in latch receivers 34. Bias springs 24 ensure that hooks 40 stay engaged in latch receivers 34 thereafter.

Again, inadvertent opening of case locking system 10 is nearly impossible. This is because in order to remove top 12 from base 14, a user must simultaneously depress more than two and in a preferred embodiment all four, latches 20 and 22 in order to overcome each of the closing bias springs 24. Sensor tabs 44 ensure that a user knows when he or she has placed his or her fingers into a position that will result in the removal of top 12 from bottom 14. If the user does not desire to remove top 12 from bottom 14 a user simply, and intuitively, moves his fingers to a different location on top 12 or lifts the case with pressure on less than the sensor tabs 44.

Applicants have determined that the case locking system 10 of the present invention may be used with any known reticle case. Importantly, applicants' case locking system 10 provides significant improvements in reticle case security no matter what the cases are made out of. Nonetheless, applicants have determined that case locking system 10 provides significant advantages when the reticle case is completely made of permanent antistatic material. Also, certain advantages are obtained when the top 12 is transparent, or the bottom 14 is transparent, or both. Also, it should be understood that case locking system 10 of the present invention can be used for any size case and in many situations. Certainly, case locking system 10 of the present invention is appropriate for use in reticle cases carrying five inch or six inch reticles.

While the present invention has been disclosed in connection with the preferred embodiment thereof, it should be understood that there may be other embodiments which fall within the spirit and scope of the invention as defined by the following claims.

What is claimed is:

1. In a case having a removable top and a bottom, a locking system comprising:
   (a) two pairs of independently movable split levers connected to opposite sides of said top forming more than two separate latches moveable between an open and a closed position, said separate latches each continuously forced in the closed position;
   (b) latch receivers in said bottom conformed to independently receive and retain each separate latch;
   (c) separate sensor tabs connected to and projecting from each latch; and
   (d) locking ramps connected to said bottom for automatically opening said latches when said top is placed onto said bottom.

2. The invention of claim 1 wherein said two pairs of independently moveable split levers forms four separate latches.

3. The invention of claim 1 further comprising a pair of hanging pins from which said split levers hang and rotate, the hanging pins having knurled ends which are securely and immovably attached to said top.

4. The invention of claim 1 further comprising alignment guides connected to said top and alignment posts connected to said bottom, said alignment posts and alignment guides cooperating together to automatically position said latches and said latch receivers when said top is placed on said bottom.

5. In a reticle case with a removable top and a bottom, a locking mechanism for automatic joining of said top to said bottom and for preventing inadvertent disconnecting of the top and bottom comprising:
   (a) two pairs of oppositely positioned split levers connected to said top and forming four independently moveable latches, said latches moveable between an open and a closed position and each latch independently spring loaded in the closed position so that all four latches must be simultaneously opened to remove the top from the bottom:
   (b) four latch receivers in said bottom conformed to receive and retain said latches when said top is placed on said bottom;
   (c) four separate sensor tabs connected to and projecting from each latch; and
   (d) locking ramps at each latch receiver for automatically opening said latches as said top is placed on said bottom.

6. The invention of claim 5 further comprising alignment guides connected to said top and alignment posts connected to said bottom conformed to work cooperatively to automatically align said latches with said latch receivers as said top is placed on said bottom.

7. The invention of claim 5 further comprising a pair of hanging pins from which said split levers and four latches hang and rotate, the hanging pins having knurled ends immovably connected to said top.

8. In a reticle case with a removable top and a bottom, a locking device comprising:
   (a) four separate latches, connected to said top, movable between an open and a closed position;
   (b) spring tensioning means connected to said top and to each of said four separate latches for tensioning said four separate latches in the closed position;
   (c) sensor tabs connected to said four separate latches;
   (d) four separate latch receivers in said bottom conformed so as to independently receive said four separate latches;
   (e) lead in locking ramp means connected to each latch receiver for automatically forcing open said four separate latches as said top is placed on said bottom; and
   (f) four alignment guide means connected to said top and four alignment post means connected to said bottom for automatically aligning the top and the bottom and the four separate latches and the four separate latch receivers as said top is placed on said bottom.

9. The invention of claim 8 further comprising a pair of hanging means for movably connecting said four separate latches to said top, one hanging means each connected to two of said four separate latches.

10. The invention of claim 9 further comprising knurled ends on said pair of hanging means immovably connected to said top.

11. The invention of claim 8 wherein said top is constructed of clear material and said bottom is constructed of opaque material.

12. The invention of claim 8 wherein said top is constructed of clear material and said bottom is constructed of clear material.

13. The invention of claim 8 wherein said reticle case top and bottom are conformed to hold a six inch reticle.

14. The invention of claim 8 wherein the entire reticle case is constructed of permanent anti-static material.

* * * * *